United States Patent
Funakoshi

(10) Patent No.: US 8,993,875 B2
(45) Date of Patent: Mar. 31, 2015

(54) SOLAR BATTERY MODULE AND METHOD FOR MANUFACTURING THE SAME

(75) Inventor: Yasushi Funakoshi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 938 days.

(21) Appl. No.: 13/002,116

(22) PCT Filed: Jul. 1, 2009

(86) PCT No.: PCT/JP2009/062038
§ 371 (c)(1),
(2), (4) Date: Dec. 30, 2010

(87) PCT Pub. No.: WO2010/001927
PCT Pub. Date: Jan. 7, 2010

(65) Prior Publication Data
US 2011/0094562 A1 Apr. 28, 2011

(30) Foreign Application Priority Data
Jul. 2, 2008 (JP) ................................ 2008-173045

(51) Int. Cl.
*H01L 31/042* (2014.01)
*H01L 31/05* (2014.01)
*B32B 17/10* (2006.01)
*H01L 31/02* (2006.01)
(Continued)

(52) U.S. Cl.
CPC ...... *H01L 31/0516* (2013.01); *B32B 17/10018* (2013.01); *B32B 17/10788* (2013.01);
(Continued)

(58) Field of Classification Search
CPC ..................... H01L 31/0516; H01L 31/02013; H01L 31/022441; H05K 1/189
USPC .................. 136/255, 256, 244; 1/255, 256
See application file for complete search history.

(56) References Cited

U.S. PATENT DOCUMENTS 4,067,764 A * 1/1978 Walker et al. ................. 156/267
4,774,434 A * 9/1988 Bennion ....................... 313/500
(Continued)

FOREIGN PATENT DOCUMENTS

| EP | 0498249 | * | 8/1992 |
| EP | 2 180 521 | | 4/2010 |

(Continued)

OTHER PUBLICATIONS

International Search Report for PCT/JP2009/062038, mailed Sep. 1, 2009.

*Primary Examiner* — Allison Bourke
(74) *Attorney, Agent, or Firm* — Nixon & Vanderhye, P.C.

(57) ABSTRACT

Provided is a solar battery module wherein solar battery cells are electrically connected to each other by using a wiring board having a predetermined wiring pattern formed on a resin base material. A method for manufacturing such solar battery module is also provided. In the wiring board of the solar battery module, a direction wherein a design margin is small is permitted to be a direction wherein the thermal contraction ratio of the resin base material is small, by the shape of an electrode pattern on the solar battery cell and that of the wiring pattern on the wiring board. At the time of manufacturing such solar battery module, temperature in a heat treatment step is set at 100° C. or higher but not higher than 180° C. Electrode designing at a fine pitch is made possible and the solar battery module exhibits high solar battery characteristics, even when the solar battery cells are connected by using wiring boards composed of various types of resin materials having thermal compression ratio not sufficiently low.

11 Claims, 7 Drawing Sheets

(51) Int. Cl.
  *H01L 31/0224*    (2006.01)
  *H01L 31/048*     (2014.01)
  *H05K 1/18*       (2006.01)
  *H05K 3/28*       (2006.01)

(52) U.S. Cl.
  CPC .... *B32B17/10871* (2013.01); *H01L 31/02013* (2013.01); *H01L 31/022441* (2013.01); *H01L 31/0485* (2013.01); *H05K 1/189* (2013.01); *H05K 3/284* (2013.01); *H05K 2201/0145* (2013.01); *H05K 2201/10143* (2013.01); *Y02E 10/52* (2013.01)
  USPC ............................. 136/256; 136/244; 136/255

(56) References Cited

U.S. PATENT DOCUMENTS

| | | |
|---|---|---|
| 5,972,732 A | 10/1999 | Gee et al. |
| 6,139,952 A | 10/2000 | Furuya et al. |
| 6,469,242 B1 | 10/2002 | Kondo |
| 2006/0134409 A1* | 6/2006 | Pecorini et al. ........... 428/355 R |
| 2007/0062574 A1* | 3/2007 | Shiomi et al. ................. 136/256 |
| 2010/0263718 A1* | 10/2010 | Abiko ........................... 136/252 |
| 2011/0094562 A1 | 4/2011 | Funakoshi |

FOREIGN PATENT DOCUMENTS

| | | |
|---|---|---|
| JP | 2001-77385 | 3/2001 |
| JP | 3626208 | 12/2004 |
| JP | 2005-294807 | 10/2005 |
| JP | 2005-340362 | 12/2005 |
| JP | 2006-255927 | 9/2006 |
| JP | 2007-19334 | 1/2007 |
| JP | 4162530 | 8/2008 |
| JP | 2009-43842 | 2/2009 |
| JP | 2009-67042 | 4/2009 |
| JP | 2010-016074 | 1/2010 |
| WO | WO 2007/091090 | 8/2007 |

* cited by examiner

SOLAR BATTERY MODULE AND METHOD FOR MANUFACTURING THE SAME

This application is the U.S. national phase of International Application No. PCT/JP2009/062038, filed 1 Jul. 2009, which designated the U.S. and claims priority to Japan Application No. 2008-173045 filed 2 Jul. 2008, the entire contents of each of which are hereby incorporated by reference.

TECHNICAL FIELD

The present invention relates to a solar battery module and a method for manufacturing the same that are able to use a wiring board which is formed of various resin materials.

BACKGROUND ART

In recent years, because of global environmental problems such as depletion of energy sources, increase in carbon dioxide in the atmosphere and the like, a clean energy source is desired to be developed, especially, photovoltaic power generation that uses solar battery cells is developed as a new energy source, put into practical use and is on the way of development. As for the solar battery cell, conventionally, the mainstream is a solar battery module that has a structure in which on a light receiving surface of a monocrystalline or polycrystalline-electroconductive-type silicon substrate, a pn junction is formed by diffusing reverse electroconductive-type impurities; and a plurality of solar battery cells, in each of which electrodes are formed on the light receiving surface and a back surface of the silicon substrate, are connected to each other.

Besides, another solar battery cell is also widespread, in which an impurity layer that contains the same electroconductive impurities at a high density is formed on a back surface of one electroconductivity type silicon substrate, so that a high output due to a back-surface field effect is obtained. Moreover, a so-called back electrode-type solar battery cell is also developed, in which an electrode is not formed on a light receiving surface of a silicon substrate; instead, a P electrode and an N electrode are formed on a back surface of the silicon substrate.

Because the back electrode-type solar battery cell generally does not have an electrode on the light receiving surface, so that it is expected to obtain a high output compared with a solar battery cell that has an electrode on each of the light receiving surface and the back surface of the silicon substrate.

Because of this, a proposition is provided, in which the back electrode-type solar battery cells are connected to each other by means of a wiring board in which wirings are formed on an insulating base, so that the connection of the back electrode-type solar battery cells becomes easy and it is possible to reduce cell flaws (e.g., see patent document 1).

PRIOR-ART DOCUMENT

Patent Document

Patent document 1: JP-A-2005-340362

SUMMARY OF THE INVENTION

Problems to be Solved by the Invention

A proposition to use a wiring board is provided to ease connection of solar battery cells, which, however, does not lead to mass-production. As a wiring board that is used in the field of semiconductors, there are a hard board in which a wiring pattern is formed of copper film and the like on a glass-epoxy base plate that has small thermal shrinkage; and a flexible board in which a wiring pattern is formed of copper film and the like on a polyimide film. However, the glass-epoxy base plate and the polyimide film used for these wiring boards are very expensive because they require 1 m² or more per unit as a material for a solar battery cell module, which is a major cause of the fact that the mass-production is not performed.

To avoid this, there is an idea to use an inexpensive material; however, an inexpensive material generally has a problem with thermal stability. As for a procedure of manufacturing a solar battery module, a wiring board is heated in a process of connecting the solar batter cells and the wiring board to each other or in a process of sealing the solar battery module by means of a weather-proof seal material, so that the wiring board is likely to be exposed to a temperature of about 150° C.

For example, in a case where instead of a polyimide film, a PET film, which has a price that is one in several tens times the price of the polyimide film, is used, in comparison of the films themselves with each other, a dimensional change of the polyimide film is 0.1% or smaller under heat treatment at 150° C. and for 30 minutes, while the PET film sometimes shrink by several percent; a dislocation occurs between the electrode of the solar battery cell and the wiring of the wiring board, which is highly likely to lead to a defective module.

Generally, if the electrodes of a back electrode-type solar battery cell are dense and have a fine pitch, a high solar battery characteristic is expectable; however, in light of the thermal shrinkage of the film, it is hard to design electrodes that are dense and have a fine pitch, which raises a problem that it is impossible to show a high solar battery characteristic.

Because of this, in light of the above problems, it is an object of the present invention is to provide a solar battery module and a method for manufacturing the same that allow electrode designing at a fine pitch and show a high solar battery characteristic even in a structure in which the solar battery cells are connected by means of a wiring board that is formed of various resin materials whose thermal shrinkages are not sufficiently low.

Means for Solving the Problem

As a result of a hard study to achieve the above object, as for a resin film which is generally manufactured by a biaxial stretch method, when manufacturing the resin film by winding it into a roll shape, a difference in thermal shrinkage ranging from several times to several tens times occurs between an MD direction (winding direction) and a TD direction (direction perpendicular to the MD); for example, as for a general inexpensive PET film, under heat treatment at 150° C. and for 30 minutes, there is about 2% thermal shrinkage in the MD direction and about 0.2% thermal shrinkage in the TD direction; in light of this, it is possible to manufacture a wiring board that is subjected to only sufficiently small influence of the thermal shrinkage by using a direction that has a fine electrode pattern and a small design margin as the TD direction, the inventor became aware of which and came to the present invention. In other words, the present invention relates a solar battery module that electrically connects solar battery cells to each other by means of a wiring board in which a predetermined wiring pattern is formed on a resin base, wherein in the wiring board, based on shapes of the electrode pattern of the solar battery cell and of the wiring pattern of the wiring board, the direction that has a small design margin is used as a direction in which the thermal shrinkage of the resin base is small.

According to this structure, by matching the direction in which the thermal shrinkage of the resin base is small with the direction which has a small design margin and needs to curb an error small, it is possible to obtain a wiring pattern in which the influence of the thermal shrinkage is curbed. Because of this, it is possible to obtain a solar battery module that includes a wiring board that is formed by means of various resin materials whose thermal shrinkages are not sufficiently low.

Besides, in the solar battery module having the above structure according to the present invention, a width direction of the wiring pattern in which a plurality of wirings are disposed adjacent to and in parallel with each other is used as the TD direction of the resin base. According to this structure, in the wiring pattern for connecting the solar battery cells that have repeated patterns which are relatively simple and the same as each other, the width direction in which the wiring is performed at a fine pitch is employed as the TD direction of the resin base; and the direction in which a large pattern margin is secured is employed as the MD direction, so that it is possible to obtain a wiring pattern that is not subjected to the influence of the thermal shrinkage.

Besides, in the solar battery module having the above structure according to the present invention, the resin base is a biaxially stretched resin film. According to this structure, it is possible to select and use a resin suitable for the wiring board from many resin materials that are generally manufactured by the biaxial stretch method.

Besides, in the solar battery module having the above structure according to the present invention, the film is a polyester-relative film. According to this structure, it is possible to manufacture the wiring board of the solar battery module by means of a resin material that is inexpensive and mass-producible.

Besides, in the solar battery module having the above structure according to the present invention, the film contains either of polyethylene terephtalate (PET) and polyethylene naphtalate (PEN). According to this structure, even by means of a resin material that has large thermal shrinkage and is very inexpensive, by using the width direction as the TD direction, it is possible to manufacture the wiring board that is subjected to only sufficiently small influence of the thermal shrinkage.

Besides, the present invention relates to a method for manufacturing the solar battery module according to any one of claims 1 to 5, wherein a temperature in a heat treatment step is kept from 100° C. or higher to 180° C. or lower.

According to this structure, even when the heat treatment is performed for adhesion, electrode connection and the like, by keeping the heat temperature at 180° C. or lower, it is possible to prevent a positional dislocation due to the thermal shrinkage even when an inexpensive resin material having a low thermal-stability temperature is used.

Besides, in the method for manufacturing the solar battery module having the above structure according to the present invention, a solder that has a melting point of 180° C. or lower or an electroconductive adhesive that hardens at a temperature of 180° C. or lower is used for the connection between the electrode of the solar battery cell and the wiring board. According to this structure, while curbing the thermal shrinkage of the resin base under the heat treatment temperature of 180° C. or lower, it is possible to surely perform the connection between the electrode of the solar battery cell and the wiring board.

Advantages of the Invention

According to the present invention, in a solar battery module that electrically connects solar battery cells to each other by means of a wiring board in which a predetermined wiring pattern is formed on a resin base, as for the wiring board, based on shapes of an electrode pattern of the solar battery cell and of the wiring pattern of the wiring board, a direction that has a small design margin is used as a direction in which thermal shrinkage of the resin base is small, the direction in which the thermal shrinkage of the resin base is small is matched with a direction which has a small design margin and needs to curb an error small, so that it is possible to obtain a wiring pattern which curbs the influence of the thermal shrinkage. Because of this, it is possible to obtain the solar batter module that includes the wiring board that is formed of various resin materials whose thermal shrinkages are not sufficiently low. Besides, by using a method for manufacturing the solar battery module in which a temperature in a heat treatment step is kept from 100° C. or higher to 180° C. or lower, it is possible to manufacture the solar battery module that includes the wiring board which prevents a positional dislocation caused by the thermal shrinkage even when various inexpensive resin materials having low thermal-stability temperatures are used.

BRIEF DESCRIPTION OF THE DRAWINGS

[FIG. 1] is a schematic description view of a solar battery cell, of which

[FIG. 3] shows a first embodiment of a solar battery cell, of which

[FIG. 5] shows an example of a solar battery module according to the present invention, of which

DESCRIPTION OF EMBODIMENTS

Hereinafter, the embodiments of the present invention are described with reference to the drawings. Besides, the same constituent members are indicated by the same reference numbers and detailed description is suitably skipped.

A solar battery module includes: a solar-battery main body portion that has a plurality of solar battery cells; a frame body that holds a circumference of the solar-battery main body portion into a unitary body; a terminal box that serves as an output portion for electric power generated by the solar-battery main portion; and an output cable connected to the terminal box; wherein the solar battery module has a structure in which in order from the surface, a light-receiving surface protection plate that is formed of light-transmissive glass or of a plastic material; a solar-battery cell seal member that is formed of a sheet-shape ethylene vinyl acetate and the like; a solar battery cell that is formed of monocrystalline silicon, polycrystalline silicon, a chemical semiconductor or the like which is sealed in the solar-battery cell seal member; and a back-film laminated body that protects the solar-battery cell seal member from a back surface are unitarily formed and built in the frame body.

Figure 1A:
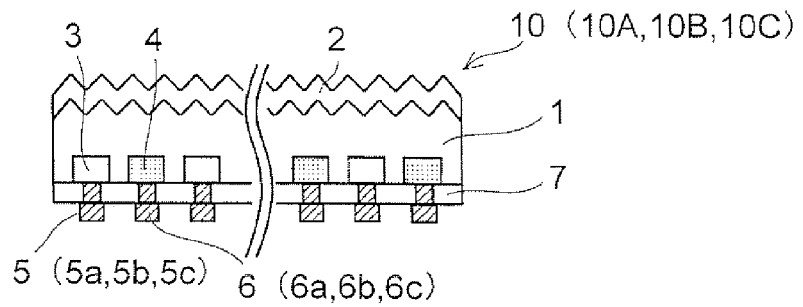
FIG. 1(a) shows a sectional schematic view.

The solar battery module has a structure in which the plurality of solar battery cells, in each of which a string is electrically wired by means of an inter-connector and an electrode is formed on a glass base plate, are set in series/in parallel with each other; placed between the light-receiving surface protection plate and the back film on the back surface; sealed by means of a light-transmissive resin; and the frame body is mounted on the circumference. The solar battery cell in the present embodiment is a back-electrode solar battery cell 10 in which both of an N electrode and a P electrode are formed on the back surface and which has, for example, a structure shown in a sectional schematic view of FIG. 1(a) which is so structured as to include: a silicon substrate 1; a reflection protective film 2 that is formed on a light receiving surface of the silicon substrate 1; an N+ layer 3 and a P+ layer 4 that are formed on a back surface of the silicon substrate 1; a passivation film 7, an N electrode 5, and a P electrode 6 that are formed on the back surface. Besides, a structure may be employed, in which another passivation film is formed between the silicon substrate 1 and the reflection protective film 2.

It is possible to form the reflection protective film 2 and the passivation film 7 of, for example, a silicon nitride film or a silicon oxide film.

Figure 1B:
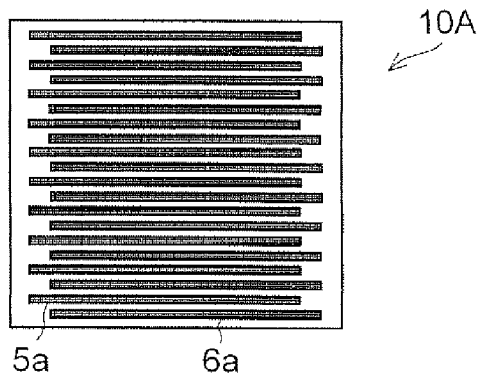
FIG. 1(b) is a plan view showing a solar battery cell on which a linear-shape electrode pattern is formed.
Figure 1C:
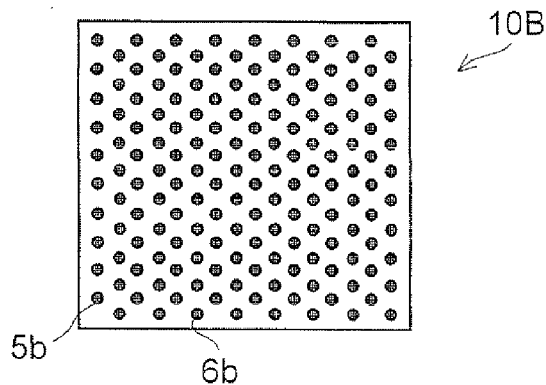
FIG. 1(c) is a plan view showing a solar battery cell on which a dot-shape electrode pattern is formed.
Figure 1D:
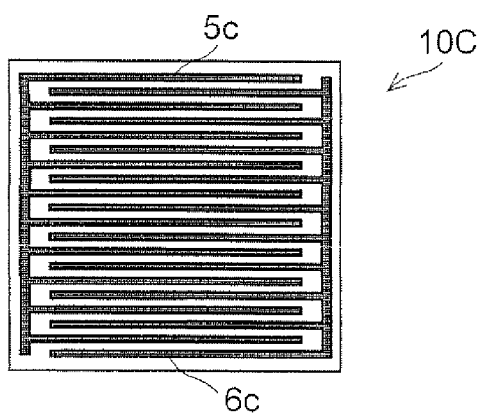
FIG. 1(d) is a plan view showing a solar battery cell on which a comb-teeth-shape electrode pattern is formed.

It is possible to form an electrode pattern disposed on the back surface into a linear-shape electrode pattern as shown in FIG. 1(b); a dot-shape electrode pattern as shown FIG. 1(c); and a comb-teeth-shape electrode pattern as shown FIG. 1(d); thus, a solar battery cell 10A is formed, on which the linear-shape electrode pattern including an N electrode 5a and a P electrode 6a that are formed into the linear shape is formed; a solar battery cell 10B is formed, on which the dot-shape electrode pattern including an N electrode 5b and a P electrode 6b that are formed into the dot shape is formed; and a solar battery cell 10C is formed, on which the comb-teeth-shape electrode pattern including an N electrode 5c and a P electrode be which are formed into the comb-teeth shape is formed. Next, a wiring board, which is mounted to connect the plurality of electrodes of the plurality of solar battery cells 10 (10A, 10B, 10C) and to draw out an electromotive force, is described.

Wiring boards are things in each of which a desired wiring pattern is formed on an insulating base plate; and include wiring boards that use a hard base plate as the insulating base plate and wiring boards that use a film base plate as the insulating base plate. The present embodiment employs a wiring board that uses a film manufactured by the biaxial stretch method.

As for the wiring board, an insulating film that serves as a base and metal foil, for example, are attached to each other by means of an adhesive and the like; a protective resist is formed into a desired shape on a surface of the metal foil; thereafter, etching is applied to exposed metal foil to remove the resist, so that the wiring board having a desired wiring pattern is formed. At this time, a direction of the film is decided in accordance with the formed wiring pattern, so that it is possible to manufacture the wiring board that is highly resistant to thermal shrinkage.

Generally, the manufacture of a film is performed by means of the biaxial stretch method, in which a dissolved resin base is wound into a roll shape, while it is stretched in a longitudinal direction (winding direction: MD direction) and in a transverse direction (TD direction: direction perpendicular to the MD direction), so that a constant-thickness film is manufactured. The method has a feature that a stress is likely to remain in the MD direction; accordingly, when thermal shrinkage occurs, the shrinkage is likely to occur in the MD direction: sometimes, the thermal shrinkage that is a few times to several tens times larger than the shrinkage in the TD direction occurs. In other words, the thermal shrinkage of the resin base in the TD direction becomes small, while the thermal shrinkage in the MD direction becomes large.

Because of this, as a resin base of a flexible wiring board that is used in the field of semiconductors, a polyimide film, which is excellent in thermal stability and whose shape change hardly occurs even when heated to two hundred and several tens degrees Celsius, is used. However, the polyimide film is very expensive, and in a case where it is used as a wiring board for a solar battery module, in light of the fact that an area equal to the module area is required, it is hard to perform the mass-production.

On the other hand, polyester-relative films such as PET (polyethylene terephtalate), PEN (polyethylene nahtalate) and the like are widespread for general uses as a packaging material and inexpensive, that is, some films have a price which is one in several tens times the price of the polyimide film. However, the polyester-relative film is considerably inferior to the polyimide film in thermal stability; although there is a case where the polyester-relative film is used as a base for a wiring board, the polyester-relative film is limited to uses in which it is not subjected to heat. For example, it is known that under heat treatment at 150° C. and for 30 minutes, a general PET film itself shows 2% thermal shrinkage in the MD direction and 0.2% thermal shrinkage in the TD direction. Actually, because metal foil is attached, the thermal shrinkage becomes smaller than the foregoing values; however, it is true that the shrinkage in the MD direction is larger than that in the TD direction. Besides, the specific shrinkage changes from wiring pattern to wiring pattern.

In a case where a wiring board is used in a solar battery module, during a time of manufacturing the module, heating at at least 100° C. or higher is required in both steps for connection to the solar battery cell and for sealing the solar battery module. Besides, as for a general PET resin, because a color change, a property change, and a deformation occur, it is necessary to keep the treatment temperature at 180° C. or lower. The same thing is also true of the PEN and other polyester-relative films although there is a sort of difference. Because of this, in a use in which a wiring board is used in a solar battery module, in the interest of thermal shrinkage, generally, in the field of semiconductors, the polyester-relative film is not used as the base of the wiring board. However, in a solar battery cell, unlike a semiconductor, it is not necessary to use a wiring pattern that is dense and complicated in both of a longitudinal direction and a transverse direction: a simple pattern that is described later is used, in which a direction that requires a high accuracy is limited to one direction; accordingly, the pattern is formed in such a way that the direction which requires the high accuracy is used as the TD direction of the resin base, while the other is used as the MD direction, so that it becomes possible to be use the polyester-relative film. According to this, it is possible to use the inexpensive polyester film for the wiring board; and as a result of this, it becomes possible to mass-produce the solar battery module.

Figure 2:
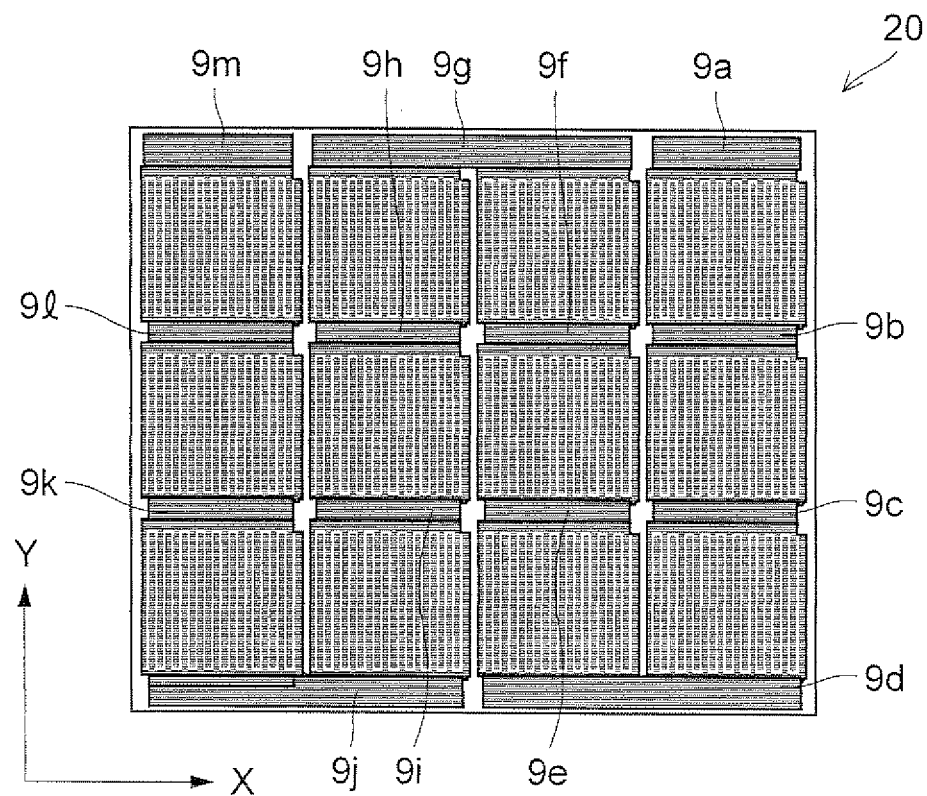
[FIG. 2] is a plan view showing an example of a wiring board.

FIG. 2 shows an example of the wiring board. This wiring board is a wiring board 20 (it is possible to dispose even an comb-teeth-shape electrode on this wiring board) that is formed with a comb-teeth-shape P wiring and an N wiring faced with each other; the comb-teeth-shape P wiring and N wiring are so formed as to correspond to the electrodes disposed on the solar battery cell 10A on which the linear-shape electrode pattern is formed or on the solar battery cell 10B on which the dot-shape electrode pattern is formed; in a case where a plurality of (e.g., 12) solar battery cells are disposed, connection wirings 9a to 9m for connecting the plurality of solar battery cells in series are provided. It is desirable that the wiring (P wiring and N wiring) that is formed corresponding to the electrode formed on the solar battery cell has a width equal to or wider than the electrode width; by connecting the electrode of the solar battery cell and the wiring of the wiring board to each other in such a way that they overlap each other, the wiring for the solar battery module is performed. As described above, by laying the electrode and the wiring on each other, it is possible to lower electric resistance in collecting electricity that is generated by the solar battery cell, so that a high solar battery characteristic is obtained.

Here, to connect the wiring of the wiring board and the solar battery cell to each other, by means of, for example, a solder that has a low melting point and a low-temperature hardening type electrocoductive adhesive, the heat temperature for the connection is kept at 180° C. or lower. In this case, if the polyester-relative film such as the PET, PEN or the like is used for the resin base of the wiring board, even at a treatment temperature that is a relatively low temperature which is 180° C. or lower, a positional dislocation due to the thermal shrinkage occurs, which is likely to lead to defective wiring. Accordingly, it is highly likely that one electrode of the solar battery cell and the wiring that connects to the other adjacent electrode come into contact with each other; because of this, a wiring board formed of a resin base is used, in which an X direction in which many wirings are so formed as to be adjacent to each other matches the TD direction of the resin base and a Y direction matches the MD direction.

As described above, by means of the wiring board 20 in which the width direction of the wiring pattern, in which the plurality of wirings are disposed adjacent to and in parallel with each other, is used as the TD direction of the resin base, the width direction in which the wiring is performed at a fine pitch is used as the TD direction of the resin base, and the direction which allows a large pattern margin to be secured is used as the MD direction of the resin base, so that it is possible to achieve a wiring pattern which is prevented from being dislocated by the thermal shrinkage and is not subjected to the influence of the thermal shrinkage.

Next, a type of solar battery cell, in which electricity is collected into a bus-bar electrode that is formed on a cell end portion via a comb-teeth-shape finger electrode of the solar battery cell, and a solar battery module including a wiring board which performs connection via a connection wiring that comes into contact with the bus-bar electrode are described with reference to FIG. 3 and FIG. 4.

Figure 3A:
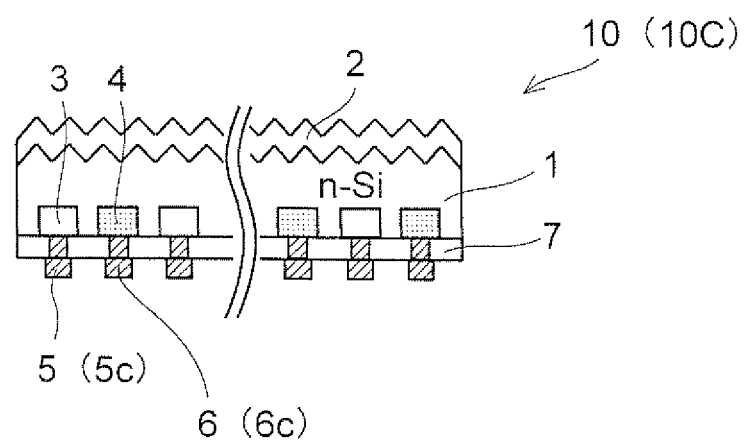
FIG. 3(a) is a sectional schematic view.
Figure 3B:
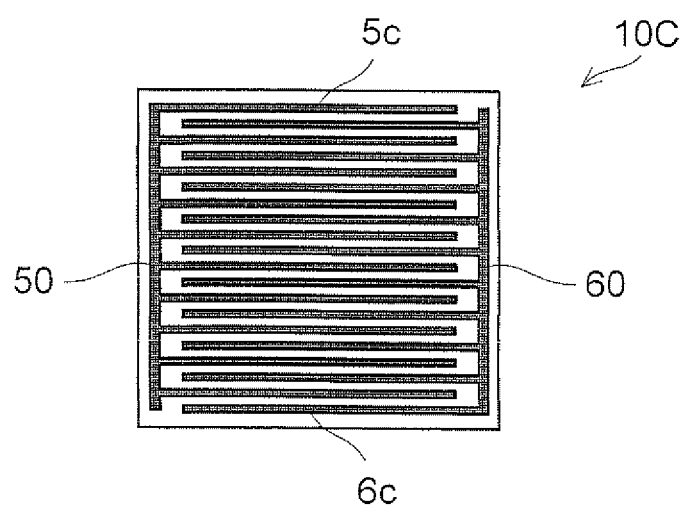
FIG. 3(b) is a plan view.

The solar battery cell 10C shown in FIG. 3(a) is a back-electrode type solar battery in which both of the N electrode 5 and the P electrode 6 are formed on the back surface; and is so structured as to include: for example, an N-type silicon substrate 1; a reflection protective film 2 that is formed on a light receiving surface of the silicon substrate 1; an N+ layer 3 and a P+ layer 4 that are formed on the back surface of the silicon substrate 1; and a passivation film 7, the N electrode 5, and the P electrode 6 that are formed on the back surface. Besides, as shown in FIG. 3(b), the N electrode 5 formed on the solar battery cell 10C in the present embodiment is a finger N electrode 5c; and the P electrode 6 is a finger P electrode 6c; these are formed into a comb-teeth shape; a bus-bar N electrode 50 and a bus-bar P electrode 60 are formed on the cell end portion.

Figure 4:
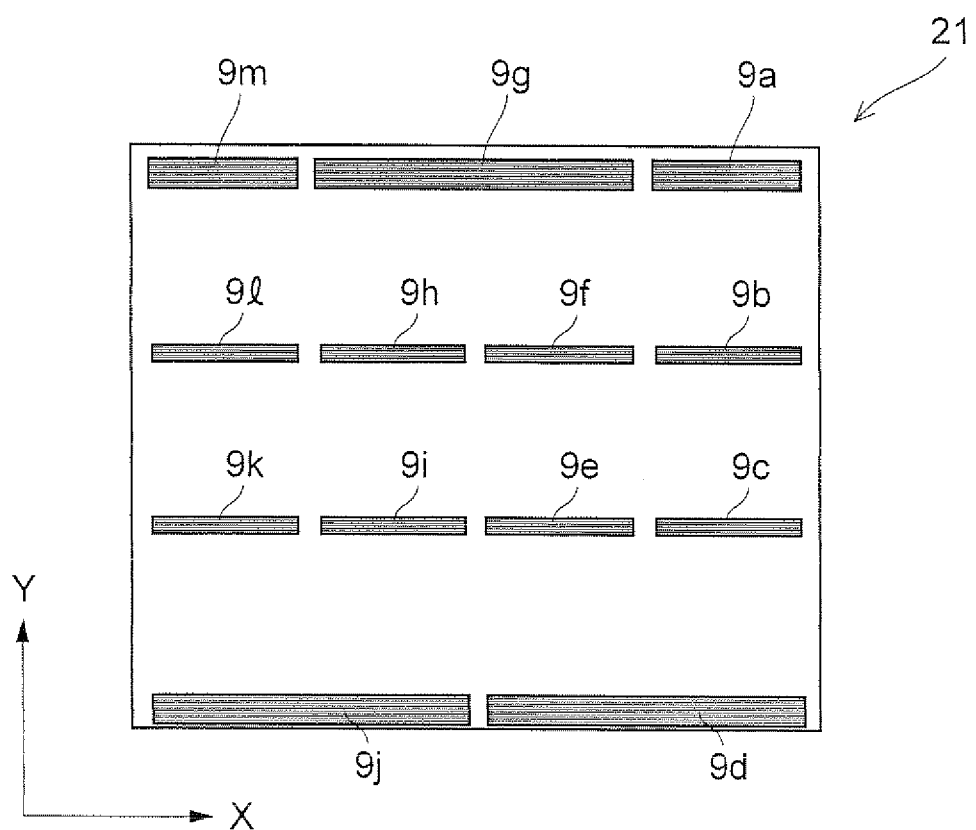
[FIG. 4] is a plan view showing another example of a wiring board.

An example of a wiring board 21 that is used corresponding to the above solar battery cell 10C is shown in FIG. 4. The wiring of the wiring board used here has: a wiring pattern that connects, in series, the bus-bar N electrode 50 and the bus-bar P electrode 60 which are adjacent to each other; and the connection wirings 9 (9a to 9m) that forms a wiring pattern that connects solar battery strings to each other.

By connecting the bus-bar electrodes (bus-bar N electrode 50, bus-bar P electrode 60) of the solar battery cell to the connection wirings 9 (9a to 9m), the wiring for the solar battery module is performed. In other words, electric currents are captured by only the finger electrode of the solar battery cell and collected into the bus-bar electrodes formed on the cell end portion. As described above, it is sufficient to perform the wiring by laying only the bus-bar portion on the connection wiring 9 of the wiring board, it is easy to perform positioning for the disposition although an idea is required to lower the resistance of the finger electrode in such a way that a loss does not occur in the finger electrode.

In this case, as for the connection between the bus-bar electrode and the connection wiring, by means of the above solder having a low melting point and the low-temperature hardening type electroconductive adhesive, it is possible to keep the heat temperature for the connection at 180° C. or lower. Besides, in this case, if the base of the wiring board is a polyester-relative film such as PET, PEN or the like, even under the treatment at 180° C. or lower, a positional dislocation due to the thermal shrinkage is likely to occur and lead to defective wiring; accordingly, it is desirable to use the wiring board 21 which as the TD direction of the resin base, uses the Y direction in the figure that is highly likely to come into contact with an end portion of the finger electrode.

As described above, by means of the wiring board 21 which as the TD direction of the resin base, uses the direction that is highly likely to come into contact with another electrode and has a small design margin, it is possible to achieve the wiring board which is prevented from being dislocated by the thermal shrinkage and is not subjected to the influence of the thermal shrinkage.

After the wiring board 21 is mounted and connected, the solar battery cells 10C and the wiring board 21 are sandwiched by means of a light-transmissive seal member such as EVA (ethylene•vinyl•acetate) or the like, a light-transmissive base plate such as glass, and a weather-proof film; heat vacuum press bonding and annealing are performed; the module is sealed; the frame body and a terminal box for drawing out electricity to outside are mounted, so that the solar battery module is completed.

As described above, based on the shapes of the electrode pattern of the solar battery cell and of the wiring pattern of the wiring board, the direction that has a small design margin is used as the direction in which the thermal shrinkage of the resin base is small; the direction in which the thermal shrinkage of the resin base is small is matched with the direction which has a small design margin and needs to curb an error small, so that it is possible to obtain the wiring pattern which curbs the influence of the thermal shrinkage; and to obtain the solar battery module that includes the wiring board which is formed of various resin materials whose thermal shrinkages are not sufficiently low.

Even in the steps of the heat vacuum press bonding and the annealing, depending on the kind of the seal member used, generally, the heating is performed at 120 to 180° C. for about 10 to 60 minutes; accordingly, if a polyester-relative film is used for the wiring board, a positional dislocation between the solar battery cell and the wiring board is likely to occur because of the thermal shrinkage. Even in this case, by using the direction that has a small design margin as the TD direction of the resin base, it is possible to prevent a defect from occurring in the module caused by a positional dislocation.

As described above, the wiring pattern used in the solar battery module is simple and has the same pattern for all the cells; accordingly, the direction that has a small design margin is used as the TD direction of the base film, and the direction has a margin is used as the MD direction, so that it becomes possible to use polyester-relative films such as PET, PEN and the like that are very inexpensive but have large thermal shrinkage.

EXAMPLES

As examples, a solar battery module M is fabricated by means of; the solar battery cell 10A on which the linear-shape electrode pattern shown in FIG. 1 is formed; and the wiring board 20 shown in FIG. 2. As for the solar battery cell 10A, as shown in FIG. 1(a), the N+ layer 3 and the P+ layer 4 are alternately formed on the back surface of the solar battery; the reflection protective film 2 including, for example, a nitride silicon film is formed on the light receiving surface, and the passivation film 7 is formed on the back surface; the N electrode 5 and the P electrode 6 are formed on the N+ layer and the P+ layer, respectively. It is possible to fabricate the solar battery cell 10A having this structure by means of a known method. Here, the solar battery cell 10A is a baked electrode that contains silver as a main component; the linear-shape N electrode 5a and the P electrode 6a are alternately formed, and the distance between the N electrode 5a and the P electrode 6a is set at 0.5 mm. Besides, the widths of both electrodes are set at 0.2 mm. Besides, a solder (Sn—Bi solder) H is applied to the surface of the electrode.

Next, as for the wiring board 20, a PET film 25 μm thick is used for the base and is attached to copper foil 35 μm thick by means of an adhesive; thereafter, a protective resist is formed and etching is performed to obtain a desired shape, so that the wiring board 20 is fabricated. On the wiring board 20, the comb-teeth-shape N wiring and P wiring are provided; and a connection wiring, which connects an N-type wiring electrically connected to an N-type electrode of the back-electrode type solar battery cell with a P-type wiring electrically connected to a P-type electrode of the solar battery cell adjacent to the N-type electrode, is formed. Besides, a wiring by which strings are connected in series with each other is also formed.

Here, the width of the wiring at the portion that overlaps the electrode of the solar battery cell is set at 0.35 mm. The reason the width of the wiring is wider than the width 0.2 mm of the above electrode is to prevent the cell characteristic from being deteriorated by electric resistance in collecting electric currents generated by the solar battery cells; and the distance from the electrode having an opposite polarity and being adjacent to the wiring is 0.15 mm. Besides, the distance between the places of the comb-teeth-shape N wiring, P wiring where the bus-bar electrodes are formed and the tip end of the solar battery cell having an opposite polarity is set at 0.5 mm. Besides, the wiring board is fabricated with the X direction of the module having the small design margin used as the TD direction of the base.

Figure 5A:
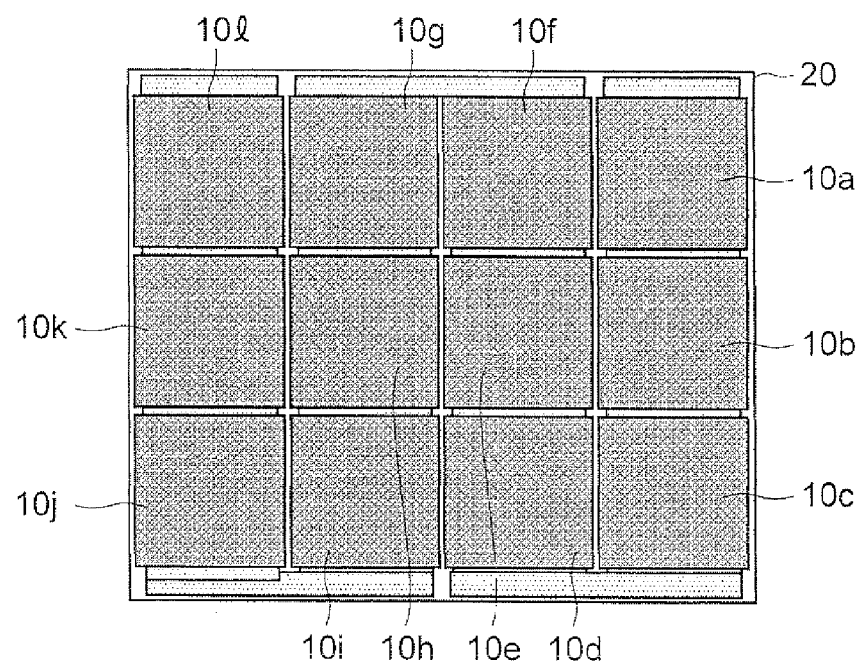
FIG. 5(a) is a plan view.
Figure 5B:
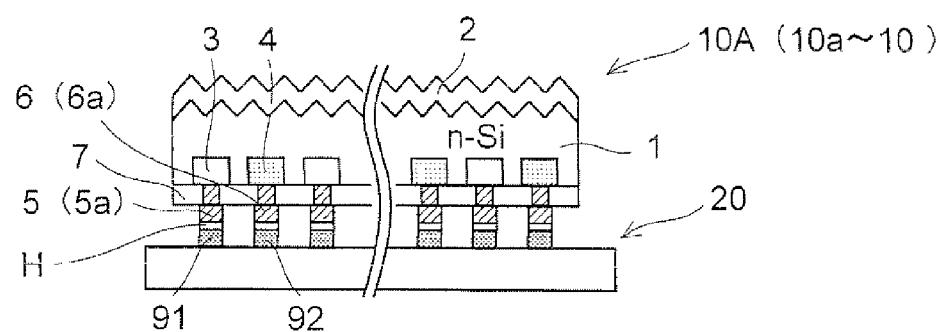
FIG. 5(b) is a sectional schematic view.

Next, as shown FIG. 5(a), a total of 12 solar battery cells 10A (10a to 10l) are placed on the wiring board and temporarily fixed by means of a UV hardening adhesive in such a way that the solar battery cell is not dislocated. And, as shown FIG. 5(b), the N electrode 5a and the N wiring 91 are electrically connected to each other by reflow soldering, and the P electrode 6a and the P wiring 92 are electrically connected to each other by reflow soldering. This reflow soldering is a soldering method in which the solder H is applied to a point to be connected in advance; an electronic component is placed on the point; and heating is performed; in the present embodiment, the peak temperature of the heating is set at 150° C.

Figure 6:
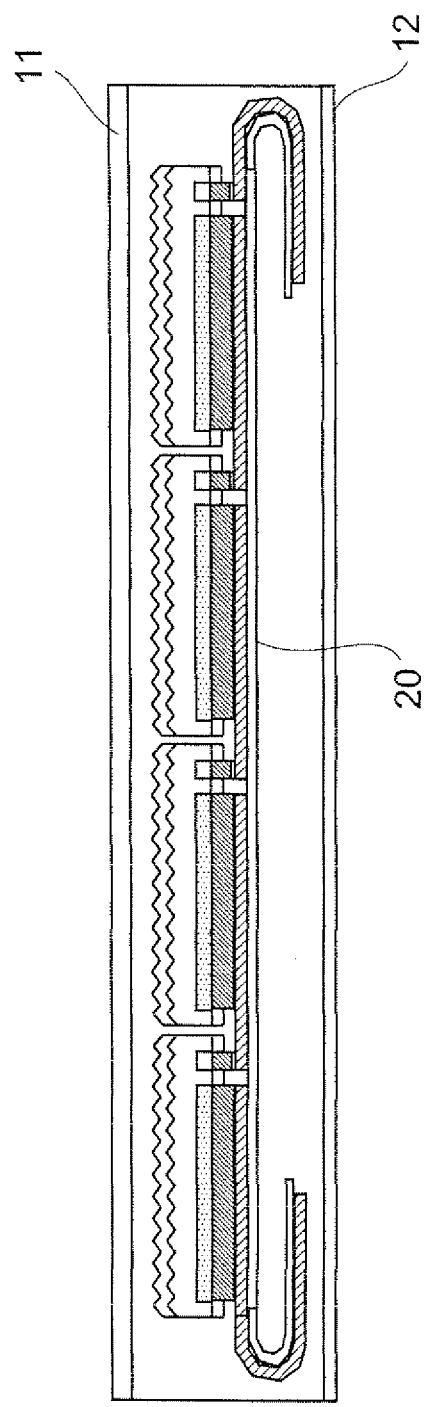
[FIG. 6] is a sectional view showing an important structure in a semi-finished state before a frame body and a terminal box of a solar battery module according to the present invention are mounted.

Next, as shown in FIG. 6, an EVA film as the seal member is disposed on the light receiving surface and on the back surface; moreover, a glass base plate 11 is disposed on the light receiving surface, and a weather-proof film 12 is disposed on the back surface; the heat vacuum press bonding is performed by means of a laminator; moreover, the annealing is performed, and the solar battery module is sealed. As for the heat temperature and the treatment time in each step are: 130° C. and for 5 minutes in the laminator, while 140° C. and for 40 minutes in the annealing.

Figure 7:
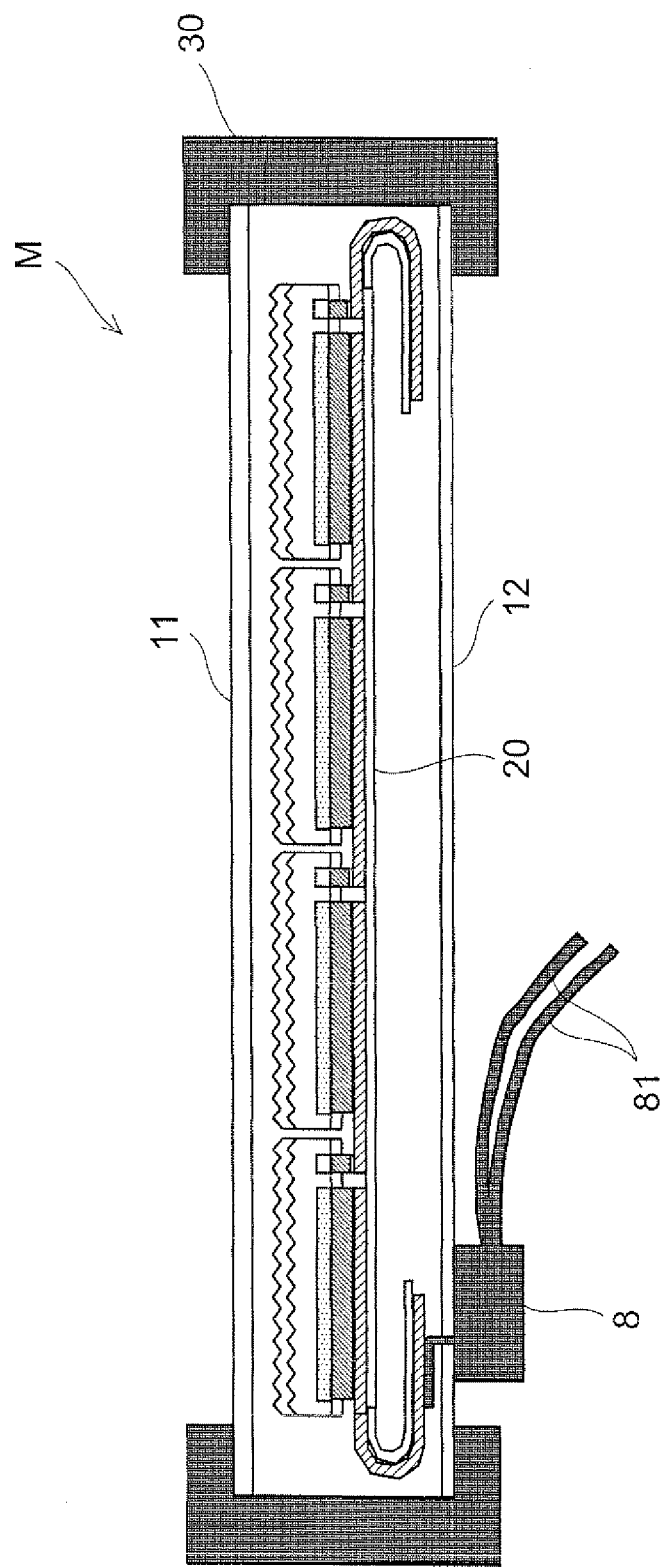
[FIG. 7] is a sectional view showing an important structure in a finished state of a solar battery module according to the present invention.

Via the above steps, as shown in FIG. 7, an aluminum frame body 30 is disposed around the module; a terminal box 8 for drawing out electricity to outside is mounted, so that 2 solar battery modules M (MA and MB) are completed. It is possible to draw out electricity generated by the solar battery module M via an output cable 81.

COMPARISON EXAMPLES

As comparison examples, the TD direction of the PET film that is the base of the wiring board is set to the Y direction, and the MD direction is set to the X direction of the board shape, that is, changed-over directions; and the other conditions are the same as those for the examples; thus, 2 solar battery modules Ma, Mb are fabricated.

Tests of checking for occurrence of defective modes and for the number of defective cells are performed for the solar battery modules MA, MB that are fabricated as the examples and the solar battery modules Ma, Mb that are fabricated as the comparison examples. The results are shown in table 1.

TABLE 1

| Module | Good/Poor Determination | Defective Mode | Defective Cell |
|---|---|---|---|
| Comparison example Ma | Poor | Short-circuit occurred | 2 |
| Comparison example Mb | Poor | Short-circuit occurred | 2 |
| Example MA | Good | Zero | Zero |
| Example MB | Good | Zero | Zero |

The cause of the defects that occur in the comparison examples is that 2 of 12 solar battery cells are short-circuited because of a positional dislocation in both of the comparison examples Ma, Mb. The 2 examples MA, MB are fabricated with no problem; and defects due to a positional dislocation do not occur at all: it is confirmed that by using the direction which does not have a dimensional margin and has a small design margin as the TD direction of the base film, the examples become unlikely to be subjected to the influence of the thermal shrinkage.

As described above, as for the resin base of the wiring board, based on the shapes of the electrode pattern of the solar battery cell and of the wiring pattern of the wiring board, the direction that has a small design margin is used as the direction in which the thermal shrinkage of the resin base is small, while the width direction in which the plurality of wirings of the wiring pattern are disposed in parallel with each other is used as the TD direction of the resin base; thus, in the wiring pattern for connecting the solar battery cells that have repeated patterns which are relatively simple and the same as each other, the width direction in which the wiring is performed at the fine pitch is used as the TD direction of the resin base; and the direction in which the large pattern margin is secured is used as the MD direction, so that it is possible to obtain the wiring pattern that is not subjected to the influence of the thermal shrinkage.

Because of this, even if the solar battery module according to the present invention has a structure in which the solar battery cells are connected by means of a wiring board that is formed of various resin materials whose thermal shrinkages are not sufficiently low, the solar battery module allows the electrode design at a fine pitch and shows a high solar battery characteristic.

Besides, as for the method according to the present invention for manufacturing a solar battery module, the solar battery module having the above structure is manufactured at the heat-treatment temperature of 100° C. or higher to 180° C. or lower, so that even if a resin material that has a low thermal-stability temperature and inexpensive is used, the manufacturing method is able to prevent a positional dislocation caused by thermal shrinkage and does not manufacturer a defective product.

Because of this, according to the present invention, in a solar battery module that connects solar batter cells to each other by means of a wiring board in which a predetermined wiring pattern is formed on a resin base, as for the wiring board, based on shapes of an electrode pattern of the solar battery cell and of the wiring pattern of the wiring board, a direction that has a small design margin is used as a direction in which thermal shrinkage of the resin base is small, the direction in which the thermal shrinkage of the resin base is small is matched with a direction which has a small design margin and needs to curb an error small, so that it is possible to obtain a wiring pattern which curbs the influence of the thermal shrinkage; and to obtain a solar battery module that includes the wiring board which is formed of various resin materials whose thermal shrinkages are not sufficiently low. Besides, by means of a method for manufacturing the solar battery module in which a temperature in a heat treatment step is kept from 100° C. or higher to 180° C. or lower, it is possible to manufacture the solar battery module that includes the wiring board which prevents a positional dislocation caused by the thermal shrinkage even when an inexpensive resin material having a low thermal-stability temperature is used.

INDUSTRIAL APPLICABILITY

The solar battery module according to the present invention becomes a solar battery module that includes a wiring board that is formed of various resin materials whose thermal shrinkages are not sufficiently low, so that the solar battery module becomes applicable to the field of solar batteries where the mass-production is required.

LIST OF REFERENCE SYMBOLS 1 silicon substrate
2 reflection protective film
3 N+ layer
4 P+ layer
5 N electrode
6 P electrode
7 passivation film
9 connection wiring
10 solar battery cell
20 wiring board
21 wiring board
30 frame body
H solder
M solar battery module

The invention claimed is:

1. A solar battery module comprising: a back electrode-type solar battery cell that includes
   an N electrode and a P electrode on a rear surface opposite to a light receiving surface;
   and a wiring board in which a wiring is formed on a resin base;
   wherein the resin base is a film that includes: an MD direction; and a TD direction which is perpendicular to the MD direction and has thermal shrinkage smaller than thermal shrinkage in the MD direction;
   the wiring includes a wiring having an N wiring corresponding to the N electrode and a P wiring corresponding to the P electrode, the P wiring and the N wiring being disposed in an interdigitated manner and extending adjacent to each other in a longitudinal direction; and
   the longitudinal direction of the N wiring and the P wiring is the MD direction.

2. The solar battery module according to claim 1, wherein the wiring pattern includes a plurality of the N wirings that are disposed into a comb-teeth shape and in parallel with each other and a plurality of the P wirings that are disposed into a comb-teeth shape and in parallel with each other; and the comb-teeth-shape N wirings and the comb-teeth-shape P wirings are disposed alternately.

3. The solar battery module according to claim 1, wherein
   the N electrode includes: a plurality of finger N electrodes that are formed into a comb-teeth shape; and a bus-bar N electrode that is disposed at an end portion of the back electrode-type solar battery cell and forms a comb shape together with the comb-teeth-shape finger N electrode;
   the P electrode includes: a plurality of finger P electrodes that are formed into a comb-teeth shape; and a bus-bar P electrode that is disposed at the end portion of the back electrode-type solar battery cell and forms a comb shape together with the comb-teeth-shape finger P electrode;
   the comb-teeth-shape finger N electrode and the comb-teeth-shape finger P electrode are disposed alternately; and
   the N wiring is connected to the bus-bar N electrode and the P wiring is connected to the bus-bar P electrode.

4. The solar battery module according to claim 1, wherein the wiring includes a connection wiring that connects the P wiring connected to the P electrode of one back electrode-type solar battery cell with the N wiring connected to the N electrode of a second back electrode-type solar battery cell that is disposed adjacent to the back electrode-type solar battery cell.

5. The solar battery module according to claim 1, wherein the resin base is a biaxially stretched resin film.

6. The solar battery module according to claim 5, wherein the film is a polyester-relative film.

7. The solar battery module according to claim 6, wherein the film contains either of a polyethylene terephtalate and a polyethylene naphtalate.

8. A method for manufacturing the solar battery module according to claim 1, wherein a temperature in a heat treatment step is kept from 100° C. or higher to 180° C. or lower.

9. The method for manufacturing the solar battery module according to claim 8, wherein a solder that has a melting point of 180° C. or lower or an electroconductive adhesive that hardens at a temperature of 180° C. or lower is used for connection between the electrodes of the solar battery cell and the wiring board.

10. A wiring board which is used to electrically connect a back electrode-type solar battery cell and in which a wiring pattern is disposed on a resin base, wherein
- the wiring pattern includes: a comb-teeth-shaped portion connected to an electrode of the back electrode-type solar battery cell; and
- a portion that connects the comb-teeth-shaped portion;
- a plurality of comb-teeth of the comb-teeth-shaped portion are disposed and arranged to extend in a longitudinal direction perpendicular to the portion that connects the comb teeth shaped portion; and
- the longitudinal direction of the comb-teeth of the comb-teeth-shaped portion is an MD direction of the resin base, wherein the resin base is a film that includes: the MD direction, and a TD direction which is perpendicular to the MD direction and has a thermal shrinkage smaller than thermal shrinkage in the MD direction.

11. A solar battery module comprising:
the wiring board according to claim 10; and
a back electrode-type solar battery cell.

* * * * *